(12) United States Patent
Lee

(10) Patent No.: US 7,339,452 B2
(45) Date of Patent: Mar. 4, 2008

(54) EMBEDDED INDUCTOR AND APPLICATION THEREOF

(75) Inventor: Sheng-Yuan Lee, Hsin-Tien (TW)

(73) Assignee: Via Technologies, Inc., Taipei Hsien (TW)

( * ) Notice: Subject to any disclaimer, the term of this patent is extended or adjusted under 35 U.S.C. 154(b) by 37 days.

(21) Appl. No.: 11/444,110

(22) Filed: May 30, 2006

(65) Prior Publication Data

US 2007/0090912 A1 Apr. 26, 2007

(30) Foreign Application Priority Data

Oct. 20, 2005 (TW) .............................. 94136672 A

(51) Int. Cl.
*H01F 5/00* (2006.01)

(52) U.S. Cl. ..................... 336/200; 336/223; 336/232

(58) Field of Classification Search ............. 366/200, 366/232, 192, 83, 223; 29/602.1
See application file for complete search history.

(56) References Cited

U.S. PATENT DOCUMENTS

| 6,498,555 | B1 * | 12/2002 | Sakata ........................ 336/200 |
| 7,038,309 | B2 * | 5/2006 | Hsu et al. .................. 257/698 |
| 7,170,384 | B2 | 1/2007 | Kim et al. .................. 336/200 |
| 2005/0190035 | A1 * | 9/2005 | Wang ......................... 336/200 |

* cited by examiner

*Primary Examiner*—Anh Mai
(74) *Attorney, Agent, or Firm*—J.C. Patents

(57) ABSTRACT

An embedded inductor suitable for a wiring board is provided. The wiring board having a plurality of patterned conductive layers and a plurality of insulating layers, and one of the insulating layers is disposed between any two adjacent of the patterned conductive layers. The embedded inductor at least includes a first conductive trace, a second conductive trace, a third conductive trace, a first conductive structure, and a second conductive structure. These conductive traces are respectively formed of different patterned conductive layers of the wiring board. The first conductive structure and the second conductive structure passing through the insulating layers connect the conductive traces in a spiral pattern. The embedded inductor with such spiral pattern is arranged on a plane that is perpendicular to the patterned conductive layers of the wiring board.

15 Claims, 4 Drawing Sheets

EMBEDDED INDUCTOR AND APPLICATION THEREOF

CROSS-REFERENCE TO RELATED APPLICATION

This application claims the priority benefit of Taiwan application serial no. 94136672, filed on Oct. 20, 2005. All disclosure of the Taiwan application is incorporated herein by reference.

BACKGROUND OF THE INVENTION

1. Field of the Invention

The present invention relates to an embedded inductor, and more particularly, to an embedded inductor that can be applied in a wiring board or a chip package.

2. Description of the Related Art

In general, the conventional wiring board for carrying and electrically connecting a plurality of electronic elements is mainly composed of a plurality of patterned conductive layers and a plurality of insulating layers. The patterned conductive layers and the insulating layers are deposited interleavedly. The patterned conductive layers are formed by performing a patterning process on the copper foil defined by photolithography and etching, and the insulating layers are respectively disposed between any two adjacent patterned conductive layers for isolating these patterned conductive layers. In addition, the interleaved patterned conductive layers are electrically connected with each other through the conductive vias passing through the insulating layers. Moreover, various electronic elements (such as active elements or passive elements) may be further disposed on the surface of the wiring board, and the electrical signal is propagated through the internal circuit of the wiring board.

The passive elements mentioned above may be a capacitor, a resistor, or an inductor, and such passive elements may be disposed on the surface of the wiring board by the SMT (Surface Mounting Technology). In addition, the passive elements may be embedded inside the wiring board to increase the layout space on the surface of the wiring board. Please refer to FIGS. 1A and 1B for the structure of the embedded inductor element. FIG. 1A is a perspective view of a conventional embedded inductor suitable for a wiring board, and FIG. 1B is a top view of the conventional embedded inductor suitable for the wiring board. The conventional embedded inductor 100 is suitable for a wiring board 10. The wiring board 10 comprises four patterned conductive layers 12, three insulating layers, and a plurality of conductive vias 16. A conductive spiral structure 110 comprising a plurality of conductive traces 112a, a plurality of row conductive traces 112b, and a plurality of conductive vias 16 is formed in a spiral pattern. The conductive traces 112a are formed of the top patterned conductive layer 12a, and the conductive traces 112a are substantially parallel to each other. Similarly, the conductive traces 112b are disposed below the bottom patterned conductive layer 12b, and the conductive traces 112b are substantially parallel to each other. Referring to FIG. 1B, the left terminals of the conductive traces 112a and 112b are defined as the first terminals, and the right terminals of the conductive traces 112a and 112b are defined as the second terminals. In addition, a second terminal of one of the conductive traces 112a is electrically coupled to a second terminal of the conductive trace 112b through the conductive via 16. The first terminal of the same conductive trace 112b is electrically connected to the first terminal of another adjacent conductive trace 112a through another conductive via 16. By repeating such structure, a solenoid inductor is formed.

However, the conventional embedded inductor occupies a large space in the wiring board. In addition, a parasitic capacitance effect occurs when the conventional embedded inductor is cooperated with other patterned conductive layers. Thus, the self-resonance frequency of the embedded inductor is decreased, and the quality factor Q of the embedded inductor is also reduced. Accordingly, how to reduce the parasitic capacitance of the conventional embedded inductor becomes a major target in designing the embedded inductor.

SUMMARY OF THE INVENTION

The present invention provides an embedded inductor suitable for applying in a wiring board. The embedded inductor comprises: a first conductive trace, a second conductive trace, a third conductive trace, a first conductive structure that passes through the wiring board, and a second conductive structure that passes through the wiring board. Wherein, the first, the second, and the third conductive traces are respectively disposed in different patterned conductive layers of the wiring board, and the different patterned conductive layers mentioned above are insulated from each other by insulating layers. The first conductive structure is electrically connected to a second terminal of the first conductive trace and a first terminal of the second conductive trace, and the second conductive structure is electrically connected to a second terminal of the second conductive trace and a first of the third conductive trace. Here, the first conductive trace, the second conductive trace, the third conductive trace, the first conductive structure, and the second conductive structure are all arranged on a plane.

The present invention further provides a chip package where the embedded inductor mentioned above is applied therein. The chip package comprises a package substrate, a chip, and an insulation material. The package substrate comprises a plurality of patterned conductive layers and a plurality of insulating layers. In addition, the package substrate has at least one embedded inductor mentioned above. The chip is on a surface of the package substrate. Moreover, the chip comprising a plurality of connection structures is electrically connected to the patterned conductive layers of the package substrate, and the connection structures of the chip are covered by the insulation material.

BRIEF DESCRIPTION OF THE DRAWINGS

The accompanying drawings are included to provide a further understanding of the invention, and are incorporated in and constitute a part of this specification. The drawings illustrate embodiments of the invention, and together with the description, serve to explain the principles of the invention.

DESCRIPTION OF THE PREFERRED EMBODIMENTS

In prior to describing the present invention in detail with reference to the embodiments, it is to be specified that in order to clearly display the structure and relative positions of the present invention, the power plane and the ground plane of the wiring board are both omitted in the accompanying drawings of the embodiments.

Figure 1A:
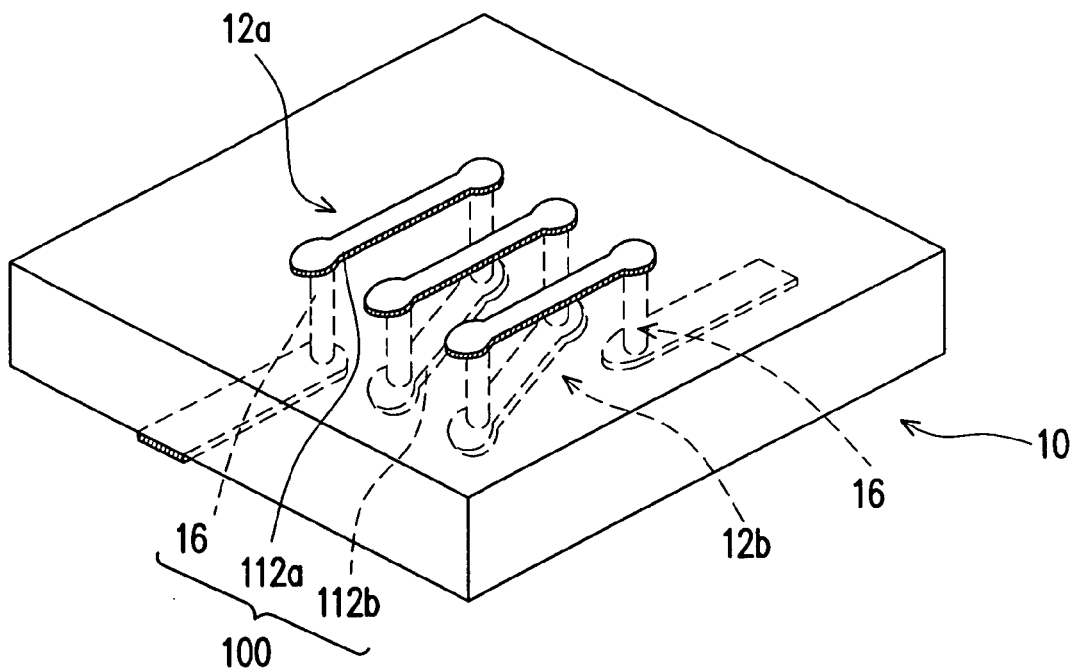
FIG. 1A is a perspective view of a conventional embedded inductor suitable for a wiring board.
Figure 1B:
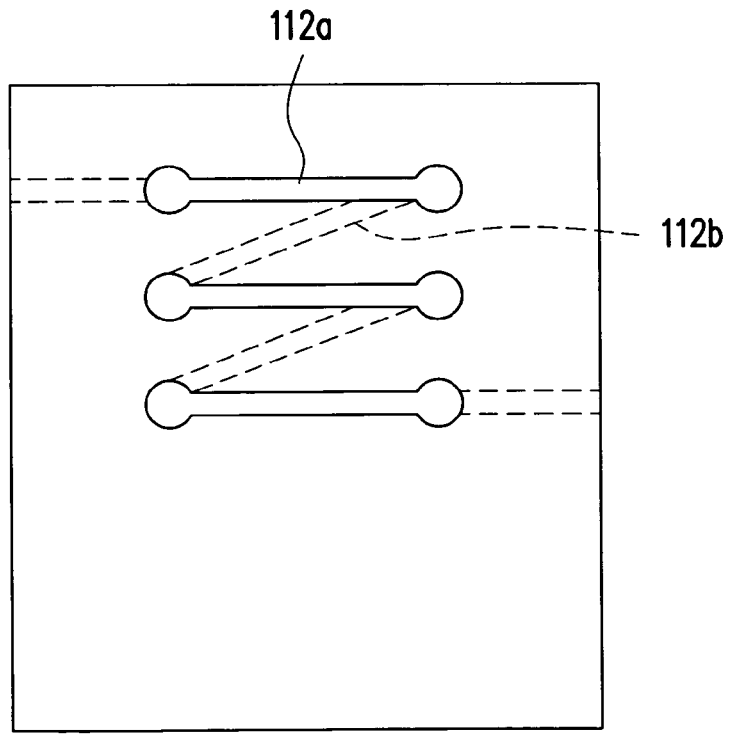
FIG. 1B is a top view of the conventional embedded inductor suitable for the wiring board.
Figure 2A:
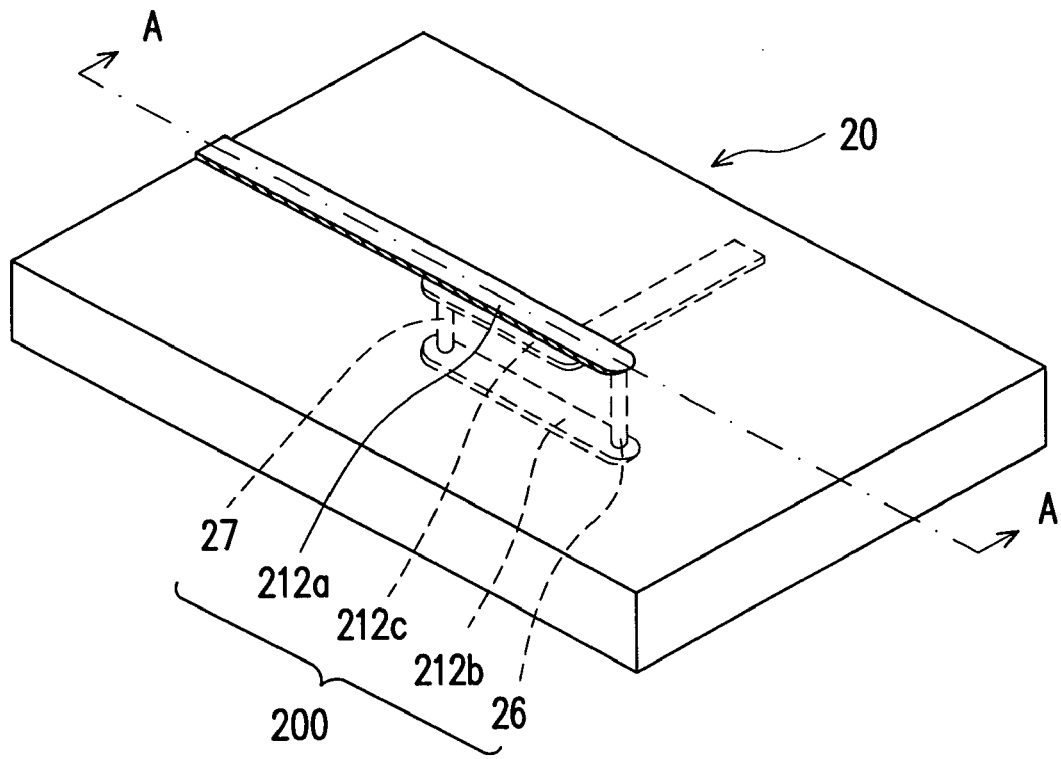
FIG. 2A is a perspective view illustrating a type of an embedded inductor applied in the wiring board according to the first embodiment of the present invention.
Figure 2B:
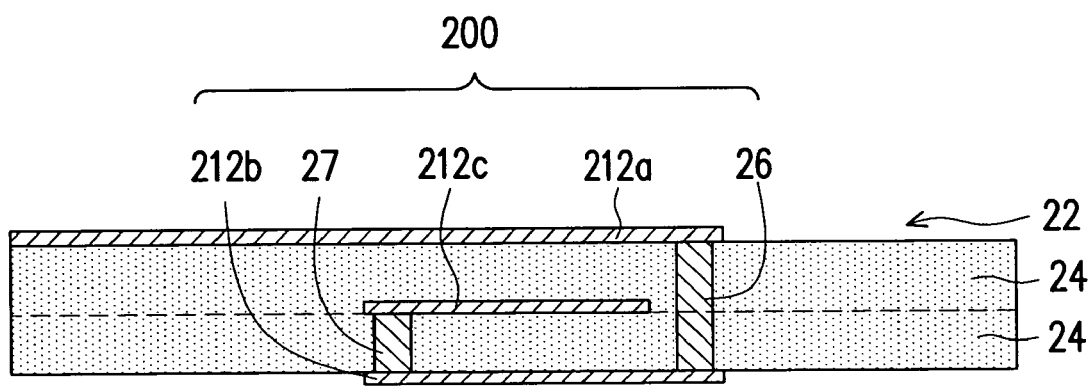
FIG. 2B is a cross-sectional view along the line A-A in FIG. 2A.

FIG. 2A is a perspective view illustrating a type of an embedded inductor applied in the wiring board according to a first embodiment of the present invention, and FIG. 2B is a cross-sectional view along the line A-A in FIG. 2A. Referring to FIGS. 2A and 2B, the embedded inductor 200 of the present embodiment is suitable for a wiring board 20. The wiring board 20 is, for example, a package substrate or a circuit board. The wiring board 20 comprises a plurality of patterned conductive layers 22 (e.g. three layers as shown in FIG. 2B) and a plurality of insulating layers 24 (e.g. two layers as shown in FIG. 2B). The insulating layer 24 is disposed between any two adjacent patterned conductive layers 22. In addition, the patterned conductive layers 22 may be formed by performing lithography and etching processes on the copper foil. The insulating layers 24 are made of a material such as FR-4 or epoxy resin, and the conductive via 26 is made of a material such as copper.

Referring to FIGS. 2A and 2B again, the embedded inductor 200 comprises a conductive trace 212a, a conductive trace 212b, a conductive trace 212c, a conductive via 26, and a conductive via 27. The conductive trace 212a is disposed in a top patterned conductive layer, and the conductive trace 212b is disposed in a bottom patterned conductive layer. In addition, the conductive trace 212c is disposed in a pattered conductive layer, and such patterned conductive layer is disposed between the top patterned conductive layer and the bottom patterned conductive layer. The conductive via 26 passes through the wiring board 20 and electrically connects one end of the conductive trace 212a to one end of the conductive trace 212b. The other end of the conductive trace 212b passes through some insulating layer 24 of the wiring board 20 through the conductive via 27 and electrically connects to one end of the conductive trace 212c. The other end of the conductive trace 212a and the other end of the conductive trace 212c, that respectively works as one terminal of the embedded inductor 200, are electrically connected to other elements through different conductive traces, respectively.

The elements included in the embedded inductor 200 are all arranged on the cross-section taken along line A-A shown in FIG. 2A, and such cross-section is perpendicular to each patterned conductive layer 22 of the wiring board 20. As shown in FIG. 2B, the embedded inductor 200 has a winding of 1 and ¼ rounds in a spiral pattern along the cross-section of the wiring board 20. The equivalent resistance of the embedded inductor 200 can be reduced by increasing the widths of the conductive traces 212a, 212b, and 212c and the diameters of the conductive vias 26 and 27. In addition, the equivalent capacitance of the embedded inductor 200 is not significantly increased. Accordingly, compared with the conventional embedded inductor, the embedded inductor 200 has a better quality factor and a compact structure.

Figure 3A:
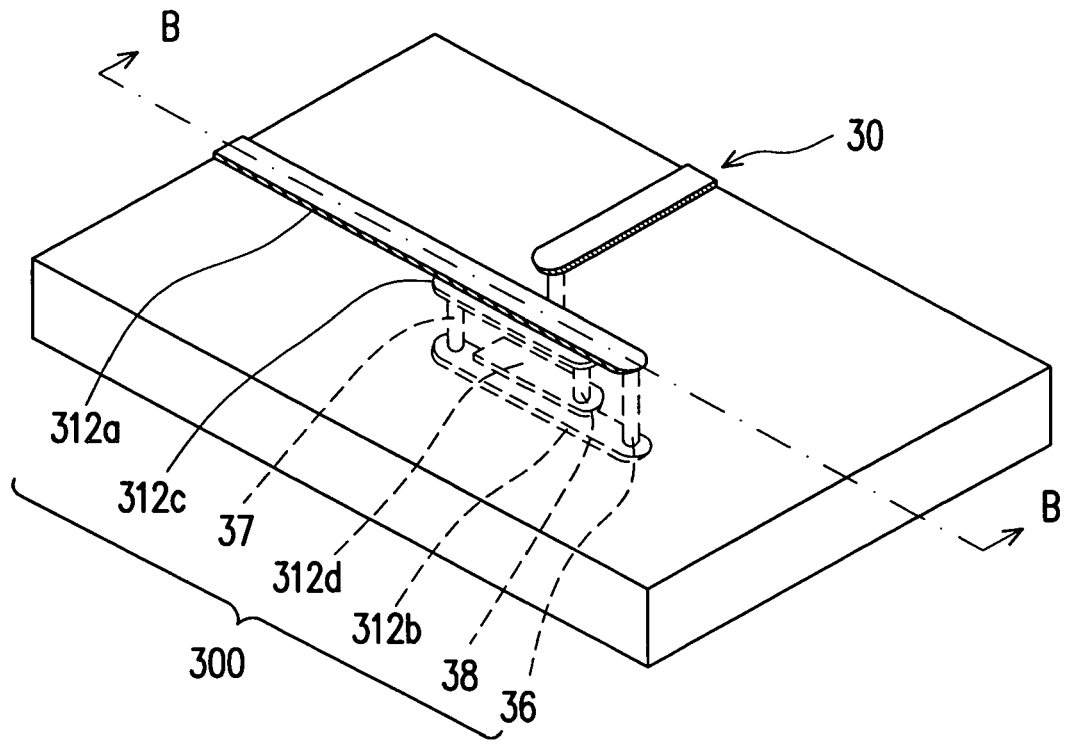
FIG. 3A is a perspective view illustrating a type of an embedded inductor applied in the wiring board according to the second embodiment of the present invention.
Figure 3B:
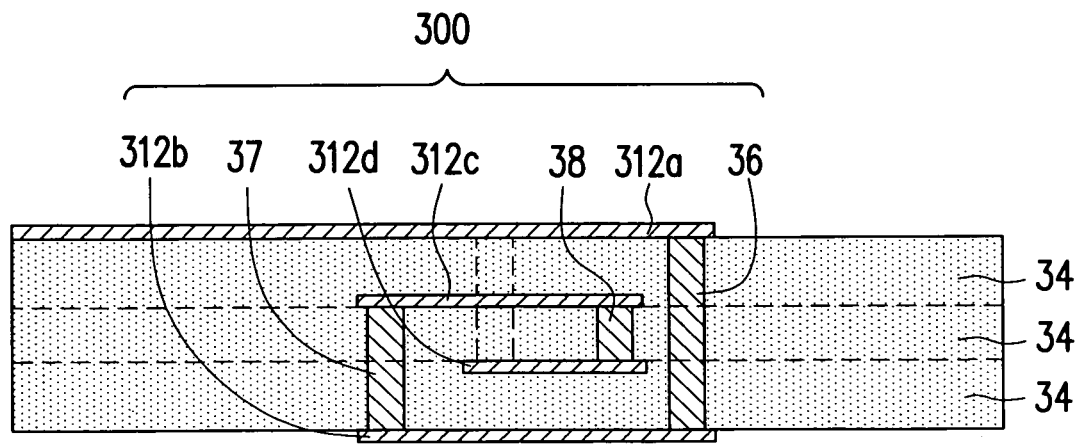
FIG. 3B is a cross-sectional view along the line B-B in FIG. 3A.

The embedded inductor 300 suitable for a wiring board 30 according to a second embodiment of the present invention is described in greater detail with reference to FIGS. 3A and 3B hereinafter. FIG. 3A is a perspective view of the embedded inductor 300, and FIG. 3B is a cross-sectional view along the line B-B in FIG. 3A. Similar to the first embodiment of the present invention, the wiring board 30 comprises four patterned conductive layers 32 and three insulating layers 34. The insulating layers 34 are disposed between any two adjacent patterned conductive layers 32.

The embedded inductor 300 comprises a conductive trace 312a, a conductive trace 312b, a conductive trace 312c, a conductive trace 312d, a conductive via 36, a conductive via 37, and a conductive via 38. The conductive trace 312a is disposed in a top patterned conductive layer, the conductive trace 312b is disposed in a bottom patterned conductive layer, and the conductive traces 312c and 312d are respectively disposed in the patterned conductive layer between the top patterned conductive layer and the bottom patterned conductive layer. The conductive via 36 passes through the wiring board 30 and electrically connects one end of the conductive trace 312a to one end of the conductive trace 312b. The other end of the conductive trace 312b passes through some insulation layers 34 of the wiring board 30 through the conductive via 37 and electrically connects to one end of the conductive trace 312c. The other end of the conductive trace 312c is electrically connected to one end of the conductive trace 312d through the conductive via 38. The other end of the conductive trace 312a and the other end of the conductive trace 312d, which respectively work as one terminal of the embedded inductor 300, are electrically connected to other elements through different conductive traces, respectively.

The elements included in the embedded inductor 300 are all arranged on the cross-section taken along line B-B shown in FIG. 3A, and such cross-section is perpendicular to each patterned conductive layer 32 of the wiring board 30. As shown in FIG. 3B, the embedded inductor 300 has a winding of 1 and ¾ rounds in a spiral pattern. Similarly, the present embodiment can provide a better quality factor and a smaller layout area. In addition, since the present invention has more wiring rounds, a higher inductance is provided.

In the embodiments of the embedded inductor mentioned above, the conductive via is used as the conductive structure between the patterned conductive layers 32 on the wiring board 30 during fabricating the wiring board. Alternatively, one plating through hole may be used as the conductive structure between the patterned conductive layers 32 on the wiring board 30.

Figure 4:
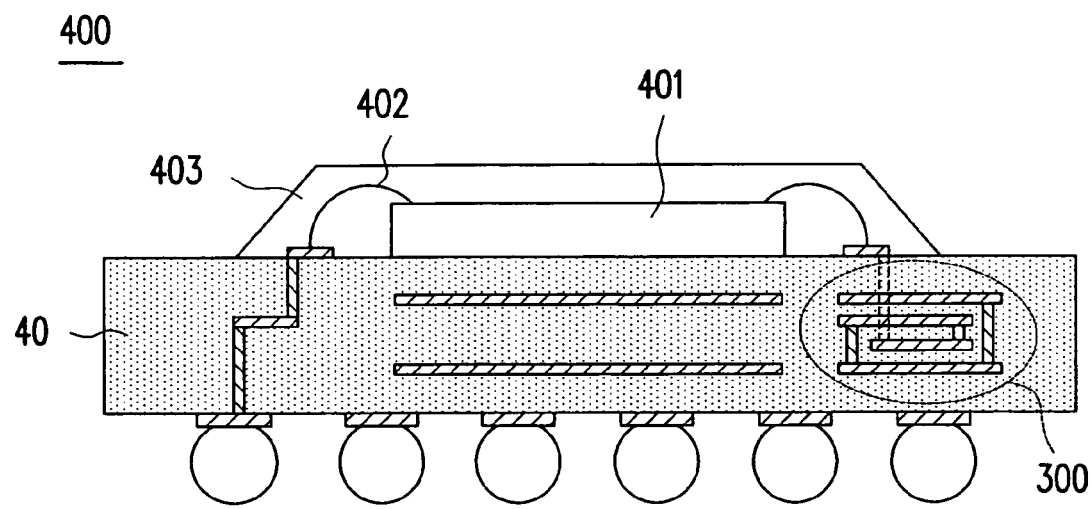
FIG. 4 is a cross-sectional view of a first chip package with the embedded inductor of the present invention.

The embedded inductor 300 of the present invention applied in a chip package 400 is described in greater detail with reference to FIG. 4 hereinafter. FIG. 4 schematically shows a cross-sectional view of the chip package 400. The chip package 400 comprises a package substrate 40 and a chip 401 that is carried on the package substrate 40. The chip 401 is electrically connected to the package substrate 40 through a plurality of bonding wires 402, and the chip 401 and the bonding wires 402 are covered by an insulation material, such that the electrical connection between the chip 401 and the package substrate 40 is protected. The package substrate 40 comprises a plurality of patterned conductive layers and a plurality of insulating layers. In addition, the patterned conductive layers inside the package substrate 40 comprise at least one embedded inductor 300.

Similarly, a case of applying the embedded inductor 301 in another chip package 500 is described in greater detail with reference to FIG. 5. The chip package 500 comprises a package substrate 50 and a chip 501 that is carried on the package substrate 50. The chip 501 is electrically connected to the package substrate 40 through a plurality of conductive bumps 502. In addition, all of the conductive bumps 502 and part of the chip 501 are covered by an insulation material, such that the electrical connection between the chip 501 and the package substrate 50 is protected. Here, the package 500 is usually referred to as a flip chip package. The package substrate 50 comprises a plurality of patterned conductive layers and a plurality of insulation layers. The patterned conductive layers inside the package substrate 50 comprise at least an embedded inductor 301 that is electrically coupled to the chip 501. Actually, the embedded inductor 301 is the embedded inductor 300 plus a conductive trace and a conductive structure to increase the number of rounds of the winding. Similarly, the number of the patterned conductive layers on the wiring board or the package substrate is also increased, and the embedded inductor of the present invention can apply the same method to increase the wiring rounds.

Figure 5:
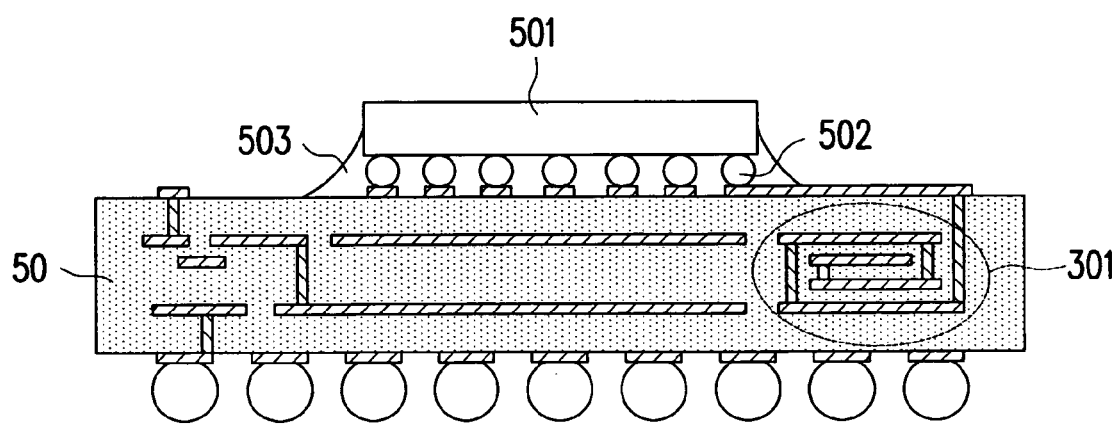
FIG. 5 is a cross-sectional view of a second chip package with the embedded inductor of the present invention.

Referring to FIGS. 4 and 5, it will be apparent to one of the ordinary skilled in the art that both of the bonding wires 402 and the conductive bumps 502 are the electrical connection structure in the chip package, and the electrical connection structure can be varied by different fabrication techniques. Nevertheless, the electrical connection structure is used as a connection interface between the chip and the package substrate.

In summary, the embedded inductor of the present invention and the application thereof at least have the following advantages:

(1) Since the embedded inductor of the present invention has a compact structure, the layout space is decreased and the manufacturing cost is further reduced.

(2) Since the embedded inductor of the present invention has a lower equivalent resistance and a lower equivalent capacitance, a higher quality factor is provided by the embedded inductor of the present invention.

(3) Since the embedded inductor of the present invention is formed by the conventional circuit board or the package substrate fabricating process, the manufacturing cost is not increased.

Although the invention has been described with reference to a particular embodiment thereof, it will be apparent to one of the ordinary skills in the art that modifications to the described embodiment may be made without departing from the spirit of the invention. Accordingly, the scope of the invention will be defined by the attached claims not by the above detailed description.

What is claimed is:

1. An embedded inductor suitable for applying in a wiring board, comprising:
   a first conductive trace in a first patterned conductive layer of the wiring board;
   a second conductive trace in a second patterned conductive layer of the wiring board;
   a third conductive trace in a third patterned conductive layer of the wiring board, wherein the third patterned conductive layer is disposed between the first patterned conductive layer and the second patterned conductive layer;
   a fourth conductive trace formed of a fourth patterned conductive layer of the wiring board, wherein the fourth patterned conductive layer is disposed between the second patterned conductive layer and the third patterned conductive layer;
   a fifth conductive trace formed of a fifth patterned conductive layer of the wiring board, wherein the fifth patterned conductive layer is disposed between the third patterned conductive layer and the fourth patterned conductive layer;
   a first conductive structure electrically connecting the first conductive trace and the second conductive trace;
   a second conductive structure electrically connecting the second conductive trace and the third conductive trace;
   a third conductive structure electrically connected to the third conductive trace and the fourth conductive trace; and
   a fourth conductive structure electrically connected to the fourth conductive trace and the fifth conductive trace,
   wherein the first conductive trace, the second conductive trace, the third conductive trace, the fourth conductive trace, the fifth conductive trace, the first conductive structure, the second conductive structure, the third conductive structure, and the fourth conductive structure are arranged spirally on a plane.

2. The embedded inductor of claim 1, wherein the wiring board further comprises a first insulating layer disposed between the first patterned conductive layer and the third patterned conductive layer, and a second insulating layer disposed between the second patterned conductive layer and the third patterned conductive layer.

3. The embedded inductor of claim 2, wherein the first conductive structure passes through the first patterned conductive layer, the second patterned conductive layer, the third patterned conductive layer, the first insulating layer, and the second insulating layer.

4. The embedded inductor of claim 2, wherein the second conductive structure passes though the second patterned conductive layer, the third patterned conductive layer, and the second insulating layer.

5. The embedded inductor of claim 1, wherein the plane is perpendicular to the first patterned conductive layer.

6. The embedded inductor of claim 1, wherein the first conductive structure is either a conductive via or a plating through hole.

7. The embedded inductor of claim 1, wherein the wiring board is either a circuit board or a package substrate.

8. A chip package, comprising:
   a substrate comprising:
      a first patterned conductive layer having a first conductive trace;
      a second patterned conductive layer having a second conductive trace;
      a third patterned conductive layer having a third conductive trace, wherein the third patterned conductive layer is disposed between the first patterned conductive layer and the second patterned conductive layer;
      a fourth patterned conductive layer having a fourth conductive trace, wherein the fourth patterned conductive layer is disposed between the second patterned conductive layer and the third patterned conductive layer;
      a fifth patterned conductive layer having a fifth conductive trace, wherein the fifth patterned conductive layer is disposed between the third patterned conductive layer and the fourth patterned conductive layer a first conductive structure electrically connecting the first conductive trace and the second conductive trace;

a second conductive structure electrically connecting the second conductive trace and the third conductive trace;

a third conductive structure electrically connected to the third conductive trace and the fourth conductive trace; and a fourth conductive structure electrically connected to the fourth conductive trace and the fifth conductive trace, wherein the first conductive trace, the second conductive trace, the third conductive trace, the fourth conductive trace, the fifth conductive trace the first conductive structure, the second conductive structure, the third conductive structure, and the fourth conductive structure are arranged spirally on a plane;

a chip loaded on the substrate, wherein the chip comprises a plurality of connection structures; and an insulating material covering the connection structures of the chip.

9. The chip package of claim 8, wherein the substrate further comprises a first insulating layer disposed between the first patterned conductive layer and the third patterned conductive layer, and a second insulating layer disposed between the second patterned conductive layer and the third patterned conductive layer.

10. The chip package of claim 9, wherein the first conductive structure passes through the first patterned conductive layer, the second patterned conductive layer, the third patterned conductive layer, the first insulating layer, and the second insulating layer.

11. The chip package of claim 9, wherein the second conductive structure passes through the second patterned conductive layer, the third patterned conductive layer, and the second insulating layer.

12. The chip package of claim 8, wherein the plane is perpendicular to the surface of the substrate.

13. The chip package of claim 8, wherein the first conductive structure is either a conductive via or a plating through hole.

14. The chip package of claim 8, wherein the connection structures of the chip are a plurality of bonding wires.

15. The chip package of claim 8, wherein the connection structures of the chip are a plurality of conductive bumps.

* * * * *